United States Patent
Li et al.

(10) Patent No.: US 6,754,048 B2
(45) Date of Patent: Jun. 22, 2004

(54) MULTIPLE MAGNETORESISTIVE (MR) LAYER SENSOR ELEMENT HAVING LONGITUDINAL BIAS LAYERS WITH NON-PARALLEL MAGNETIZATIONS

(75) Inventors: Min Li, Fremont, CA (US); Simon H. Liao, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/920,602

(22) Filed: Aug. 2, 2001

(65) Prior Publication Data

US 2003/0039078 A1 Feb. 27, 2003

Related U.S. Application Data

(62) Division of application No. 09/374,310, filed on Aug. 16, 1999, now Pat. No. 6,295,718.

(51) Int. Cl.$^7$ .................................................. G11B 5/39
(52) U.S. Cl. .................................... 360/315; 360/327.3
(58) Field of Search ................................. 360/314, 316, 360/327.1–327.32; 149/108; 438/3, 48, 104, 720, 722, 381, 171, 210

(56) References Cited

U.S. PATENT DOCUMENTS

| | | | | | |
|---|---|---|---|---|---|
| 5,561,896 | A | * | 10/1996 | Voegeli et al. | ............ 29/603.08 |
| 5,650,887 | A | * | 7/1997 | Dovek et al. | ................. 360/75 |
| 5,684,658 | A | * | 11/1997 | Shi et al. | ..................... 360/315 |
| 5,766,780 | A | * | 6/1998 | Huang et al. | ............... 428/682 |
| 5,783,460 | A | * | 7/1998 | Han et al. | ....................... 438/3 |
| 5,825,595 | A | * | 10/1998 | Gill | ............................. 360/314 |
| 5,859,753 | A | * | 1/1999 | Ohtsuka et al. | ............. 360/314 |
| 5,859,754 | A | * | 1/1999 | Tong et al. | ................. 360/314 |
| 6,295,718 | B1 | * | 10/2001 | Li et al. | .................. 29/603.08 |
| 6,310,751 | B1 | * | 10/2001 | Guo et al. | .................. 360/315 |

* cited by examiner

Primary Examiner—A. J. Heinz
(74) Attorney, Agent, or Firm—George O. Saile; Stephen B. Ackerman (57) ABSTRACT

Within a method for forming a magnetoresistive (MR) sensor element there is first provided a substrate. There is then formed over the substrate a first magnetoresistive (MR) layer having formed contacting the first magnetoresistive (MR) layer a magnetically biased first magnetic bias layer biased in a first magnetic bias direction with a first magnetic bias field strength. There is also formed separated from the first magnetoresistive (MR) layer by a spacer layer a second magnetoresistive (MR) layer having formed contacting the second magnetoresistive (MR) layer a magnetically un-biased second magnetic bias layer. There is then biased through use of a first thermal annealing method employing a first thermal annealing temperature, a first thermal annealing exposure time and a first extrinsic magnetic bias field the magnetically un-biased second magnetic bias layer to form a magnetically biased second magnetic bias layer having a second magnetic bias field strength in a second magnetic bias direction non-parallel to the first magnetic bias direction while simultaneously partially demagnetizing the magnetically biased first magnetic bias layer to provide a partially demagnetized magnetically biased first magnetic bias layer having a partially demagnetized first magnetic bias field strength less than the first magnetic bias field strength. Finally, there is then annealed thermally through use of a second thermal annealing employing a second thermal annealing temperature and a second thermal annealing exposure time without a second magnetic bias field: (1) the partially demagnetized magnetically biased first magnetic bias layer layer to form a remagnetized partially demagnetized first magnetic bias layer having a remagnetized partially demagnetized first netic bias field strength greater than the partially demagnetized first magnetic bias field strength; and (2) the magnetically biased second magnetic bias layer to form a further magnetically biased second magnetic bias layer having a further magnetized second magnetic bias field strength greater than the second magnetic bias field strength.

6 Claims, 5 Drawing Sheets

MULTIPLE MAGNETORESISTIVE (MR) LAYER SENSOR ELEMENT HAVING LONGITUDINAL BIAS LAYERS WITH NON-PARALLEL MAGNETIZATIONS

CROSS-REFERENCE TO RELATED APPLICATIONS

This is a division of patent application Ser. No. 09/374,310, filing date Aug. 16, 1999 now U.S. Pat. No. 6,295,718, Method For Fabricating A Non-Parallel Magnetically Biased Multiple Magetoresistive (Mr) Layer Manetoresistive (Mr) Sensor Element, assigned to the same assignee as the present invention.

This application is related to co-assigned applications: (1) Ser. No. 09/182,761, filed Oct. 30, 1998, titled "Canted Longitudinal Patterned Exchange Biased Dual-Stripe Magnetoresistive (DSMR) Sensor Element and Method for Fabrication Thereof"; and (2) Ser. No. 09/182,775, also filed Oct. 30, 1998, titled "Anti-Parallel Longitudinal Patterned Exchange Biased Dual Stripe Magnetoresistive (DSMR) Sensor Element and Method for Fabrication Thereof", the teachings and citations from both of which related co-assigned applications are incorporated herein fully by reference.

BACKGROUND OF THE INVENTION

1. Field of the Invention

The present invention relates generally to methods for fabricating magnetic sensor elements. More particularly, the present invention relates to methods for fabricating non-parallel magnetically biased multiple magnetoresistive (MR) layer magnetoresistive (MR) sensor elements.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically determined as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data from and into the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data from and into a magnetic data storage medium, it is known in the art of magnetic read-write head fabrication that magnetoresistive (MR) sensor elements employed within magnetoresistive (MR) read-write heads are generally superior to other types of magnetic sensor elements when employed in retrieving digitally encoded magnetic data from a magnetic data storage medium. In that regard, magnetoresistive (MR) sensor elements are generally regarded as superior since magnetoresistive (MR) sensor elements are known in the art to provide high output digital read signal amplitudes, with good linear resolution, independent of the relative velocity of a magnetic data storage medium with respect to a magnetoresistive (MR) read-write head having the magnetoresistive (MR) sensor element incorporated therein.

Within the general category of magnetoresistive (MR) sensor elements, magnetoresistive (MR) sensor elements which employ multiple magnetoresistive (MR) layers (typically including a pair of magnetoresistive (MR) layers), such as but not limited to dual stripe magnetoresistive (DSMR) sensor elements and spin valve magnetoresistive (DSVMR) sensor elements, and in particular magnetoresistive (MR) sensor elements which employ multiple magnetoresistive (MR) layers at least one of which is magnetically biased to provide non-parallel magnetic bias directions of the multiple magnetoresistive (MR) layer magnetoresistive (MR) sensor elements, such as nominally anti-parallel longitudinally magnetically biased dual stripe magnetoresistive (DSMR) sensor elements and nominally perpendicularly magnetically biased spin valve magnetoresistive (DSVMR) sensor elements, are presently of considerable interest insofar as the magnetically biased magnetoresistive (MR) layers employed within such magnetically biased multiple magnetoresistive (MR) layer magnetoresistive (MR) sensor elements typically provide enhanced magnetic read signal amplitude and fidelity in comparison with single stripe magnetoresistive (MR) sensor elements, non-magnetically biased multiple magnetoresistive (MR) layer magnetoresistive (MR) sensor elements and parallel magnetically biased multiple magnetoresistive (MR) layer magnetoresistive (MR) sensor elements.

While non-parallel magnetically biased multiple magnetoresistive (R) layer magnetoresistive (MR) sensor elements such as but not limited to non-parallel longitudinally magnetically biased dual stripe magnetoresistive (DSMR) sensor elements and non-parallel perpendicularly magnetically biased dual spin valve magnetoresistive (DSVMR) sensor elements are thus desirable within the art of digitally encoded magnetic data storage and retrieval, non-parallel multiple magnetoresistive (MR) layer magnetoresistive (MR) sensor elements are nonetheless not fabricated entirely without problems in the art of magnetoresistive (MR) sensor element fabrication. In particular, as a data track width within a magnetic medium employed within digitally encoded magnetic data storage and retrieval decreases, it becomes increasingly important that a read track width within a non-parallel magnetically biased multiple magnetoresistive (MR) layer magnetoresistive (MR) sensor element employed in reading the data within the data track be uniformly magnetically biased (i.e. have a uniform cross-track magnetic bias profile). Uniform cross-track magnetic bias profiles are desirable within read track widths of non-parallel magnetically biased multiple magnetoresistive (MR) layer magnetoresistive (MR) sensor elements since such uniform cross-track magnetic bias profiles provide for optimal magnetic read signal amplitudes within such non-parallel magnetically biased multiple magnetoresistive (MR) layer magnetoresistive (MR) sensor elements.

It is thus towards the goal of providing, for use within magnetic data storage and retrieval, a method for forming a non-parallel magnetically biased multiple magnetoresistive (MR) layer magnetoresistive (MR) sensor element with a uniform cross-track magnetic bias profile across a read track width of the non-parallel magnetically biased multiple magnetoresistive (MR) layer magnetoresistive (MR) sensor element, as well as a non-parallel magnetically biased multiple magnetoresistive (MR) layer magnetoresistive (MR) sensor element formed in accord with the method, that the present invention is most generally directed.

Various methods and resultant magnetoresistive (MR) sensor element structures have been disclosed in the art of magnetoresistive (MR) sensor element fabrication for forming magnetically biased magnetoresistive (MR) sensor elements with enhanced functionality, enhanced reliability or other desirable properties.

For example, Voegeli et al., in U.S. Pat. No. 5,561,896, discloses a method for fabricating, with enhanced longitudinal magnetic bias characteristics, enhanced fabrication simplicity and enhanced reliability, a longitudinally magnetically biased magnetoresistive (MR) sensor element for use within magnetic data storage and retrieval. The method employs an "H" shaped laminate formed of a soft magnetoresistive (MR) material layer laminated to an interdiffusion material layer, where upon thermally induced interdiffusion of the soft magnetoresistive (MR) material layer and the interdiffusion material layer there is formed a hard magnetic bias material layer therefrom, and where interdiffusion of the soft magnetoresistive (MR) material layer with the interdiffusion material layer is effected by an electrical pulsing through a pair of leg portions of the "H" but not a horizontal connector portion of the "H", such that the pair of leg portions of the "H" is transformed into a pair of hard magnetic bias material layers while the horizontal connector portion of the "H" remains un-interdiffused as the soft magnetoresistive (MR) material layer which is longitudinally magnetically biased by the pair of hard bias magnetic bias material layers formed from the thermally interdiffused leg portions of the "H".

In addition, Dovek et al., in U.S. Pat. No. 5,650,887, discloses a system for retrieving magnetic data from a magnetic data storage medium while employing a spin valve magnetoresistive (SVMR) sensor element, and a disk drive magnetic data storage enclosure which employs the system for retrieving the magnetic data from the magnetic data storage medium while employing the spin valve magnetoresistive (SVMR) sensor element, where the spin-valve magnetoresistive (SVMR) sensor element may be readily reset to its original magnetic orientation subsequent to an event which dislocates within the spin valve magnetoresistive (SVMR) sensor element a magnetic exchange bias pinned layer from its original magnetic orientation within the spin-valve magnetoresistive (SVMR) sensor element. To achieve the foregoing result, the system employs: (1) an electrical current waveform directed through the spin-valve magnetoresistive (SVMR) sensor element with an initial current sufficient to heat a magnetic exchange bias pinning layer within the spin-valve magnetoresistive (SVMR) sensor element above its blocking temperature; and (2) a subsequent lower current sufficient to generate a magnetic field around the magnetic exchange bias pinned layer pinned by the magnetic exchange bias pinning layer to properly magnetically orient the magnetic exchange bias pinned layer while the magnetic exchange bias pinning layer is cooling below its blocking temperature.

Further, Shi et al., in U.S. Pat. No. 5,684,658, discloses a dual stripe magnetoresistive (DSMR) sensor element and a method for fabricating the dual stripe magnetoresistive (DSMR) sensor element, where the dual stripe magnetoresistive (DSMR) sensor element has a narrow read back width which in turn provides that the narrow read back width dual stripe magnetoresistive (DSMR) sensor element may be employed for reading digitally encoded magnetic data within narrowly spaced tracks within a magnetic data storage medium. The dual stripe magnetoresistive (DSMR) sensor element realizes the foregoing object by employing when forming the dual stripe magnetoresistive (DSMR) sensor element: (1) an offset of a first magnetoresistive (MR) layer with respect to a second magnetoresistive (MR) layer within the dual stripe magnetoresistive (DSMR) sensor element; (2) a parallel longitudinal magnetic biasing of the first magnetoresistive (MR) layer with respect to the second magnetoresistive (MR) layer within the dual stripe magnetoresistive (DSMR) sensor element; and (3) an anti-parallel electromagnetic biasing of the first magnetoresistive (MR) layer with respect to the second magnetoresistive (MR) layer within the dual stripe magnetoresistive (DSMR) sensor element.

Still further, Han et al., in U.S. Pat. No. 5,783,460, discloses a method for fabricating a dual stripe magnetoresistive (DSMR) sensor element, where there is minimized tolerance variations with respect to the width and/or alignment between a pair of magnetoresistive (MR) layers within the dual stripe magnetoresistive (DSMR) sensor element. To realize the foregoing object, the method employs a lift off stencil as an etch mask for forming from a trilayer blanket stack layer comprising: (1) a blanket first magnetoresistive (MR) layer having formed thereupon; (2) a blanket inter-stripe dielectric layer, in turn having formed thereupon; (3) a blanket second magnetoresistive (MR) layer, a corresponding trilayer patterned stack layer comprising: (1) patterned first magnetoresistive (MR) layer having formed thereupon; (2) a patterned inter-stripe dielectric layer in turn having formed thereupon; (3) a patterned second magnetoresistive (MR) layer, wherein the series of three foregoing patterned layers within the trilayer patterned stack layer in turn has a series of fully aligned edges.

Finally, Ohtsuka et al., in U.S. Pat. No. 5,859,753, discloses a spin-valve magnetoresistive (SVMR) sensor element, and a method for fabricating the spin-valve magnetoresistive (SVMR) sensor element, where the spin-valve magnetoresistive (SVMR) sensor element has an attenuated susceptibility to thermal asperities and electrostatic discharge when employing the spin-valve magnetoresistive (SVMR) sensor element for retrieving magnetic data from a magnetic data storage medium. The spin-valve magnetoresistive (SVMR) sensor element realizes the foregoing objects by employing a dual spin-valve magnetoresistive (DSVMR) sensor element construction wherein: (1) a pair of pinned magnetoresistive layers within the dual spin-valve magnetoresistive (DSVMR) sensor element is magnetically pinned in opposite directions; and (2) one conductor lead layer within each pair of conductor lead layers employed within the dual spin-valve magnetoresistive (DSVMR) sensor element construction is positioned with respect to the magnetic data storage medium from which is retrieved magnetic data further removed than the other conductor lead layer within the pair of conductor lead layers.

Desirable within the art of non-parallel magnetically biased multiple magnetoresistive (MR) layer magnetoresistive (MR) sensor element fabrication are additional methods and materials which may be employed for forming non-parallel magnetically biased multiple magnetoresistive (MR) layer magnetoresistive (MR) sensor elements with enhanced magnetic bias profile uniformity of the non-parallel magnetically biased multiple magnetoresistive (MR) layer magnetoresistive (MR) sensor elements within the trackwidths of the non-parallel magnetically biased multiple magnetoresistive (MR) layer magnetoresistive (MR) sensor elements.

It is towards the foregoing object that the present invention is directed.

SUMMARY OF THE INVENTION

A first object of the present invention is to provide a non-parallel magnetically biased multiple magnetoresistive (MR) layer magnetoresistive (MR) sensor element, and a method for fabricating the non-parallel magnetically biased multiple magnetoresistive (MR) layer magnetoresistive (MR) sensor element, where the non-parallel magnetically biased multiple magnetoresistive (MR) layer magnetoresistive (MR) sensor element has an enhanced magnetic bias profile uniformity within a trackwidth of the non-parallel magnetically biased multiple magnetoresistive (MR) layer magnetoresistive (MR) sensor element.

A second object of the present invention is to provide a non-parallel magnetically biased multiple magnetoresistive (MR) layer magnetoresistive (MR) sensor element and a method for fabricating the non-parallel magnetically biased multiple magnetoresistive (MR) layer magnetoresistive (MR) sensor element in accord with the first object of the present invention, which method is readily commercially implemented.

In accord with the objects of the present invention, there is provided by the present invention a method for fabricating a non-parallel magnetically biased multiple magnetoresistive (MR) layer magnetoresistive (MR) sensor element. To practice the method of the present invention, there is first provided a substrate. There is then formed over the substrate a first magnetoresistive (NM) layer. There is also formed contacting the first magnetoresistive (MR) layer a magnetically biased first magnetic bias layer, where the magnetically biased first magnetic bias layer is biased in a first magnetic bias direction with a first magnetic bias field strength. There is also formed separated from the first magnetoresistive (MR) layer by a spacer layer a second magnetoresistive (MR) layer. There is also formed contacting the second magnetoresistive (MR) layer a magnetically un-biased second magnetic bias layer. There is then biased through use of a first thermal annealing method employing a first thermal annealing temperature, a first thermal annealing exposure time and a first extrinsic magnetic bias field strength the magnetically un-biased second magnetic bias layer to form a magnetically biased second magnetic bias layer having a second magnetic bias field strength in a second magnetic bias direction non-parallel to the first magnetic bias direction while simultaneously partially demagnetizing the magnetically biased first magnetic bias layer to form a partially demagnetized magnetically biased first magnetic bias layer having a partially demagnetized first magnetic bias field strength less than the first magnetic bias field strength. Finally, there is then annealed thermally through use of a second thermal annealing employing a second thermal annealing temperature and a second thermal annealing exposure time without a second magnetic bias field: (1) the partially demagnetized magnetically biased first magnetic bias layer to form a remagnetized partially demagnetized first magnetic bias layer having a remagnetized partially demagnetized first magnetic bias field strength greater than the partially demagnetized first magnetic bias field strength; and (2) the magnetically biased second magnetic bias layer to form a further magnetically biased second magnetic bias layer having a further magnetized second magnetic bias field strength greater than the second magnetic bias field strength.

Advantageously, the method of the present invention provides that: (1) a first magnetic bias layer from which is formed the magnetically biased first magnetic bias layer; and (2) the second magnetic bias layer, may both be formed from a single magnetic bias material. Thus, use of such a single magnetic bias material assists in optimizing a cross-track magnetic bias profile uniformity of a non-parallel magnetically biased multiple magnetoresistive (MR) layer magnetoresistive (MR) sensor element. To the extent not previously disclosed or claimed within the art of magnetoresistive (MR) sensor element fabrication, the present invention also contemplates various non-parallel magnetically biased multiple magnetoresistive (MR) layer magnetoresistive (MR) sensor elements formed employing multiple non-parallel magnetically biased magnetic bias layers formed of a single magnetic bias material.

The present invention provides a non-parallel magnetically biased multiple magnetoresistive (MR) layer magnetoresistive (MR) sensor element, and a method for fabricating the non-parallel magnetically biased multiple magnetoresistive (MR) layer magnetoresistive (MR) sensor element, where the non-parallel magnetically biased multiple magnetoresistive (MR) layer magnetoresistive (MR) sensor element has an enhanced magnetic bias profile uniformity within a trackwidth of the non-parallel magnetically biased multiple magnetoresistive (MR) layer magnetoresistive (MR) sensor element. The method of the present invention realizes the foregoing object by employing when fabricating the non-parallel magnetically biased multiple magnetoresistive (MR) layer magnetoresistive (MR) sensor element: (1) a first thermal annealing method employing a first thermal annealing temperature, a first thermal annealing exposure time and a first extrinsic magnetic bias field strength to form from a magnetically un-biased second magnetic bias layer a magnetically biased second magnetic bias layer having a second magnetic bias field strength in a second magnetic bias direction non-parallel to a first magnetic bias direction of a magnetically biased first magnetic bias layer, while simultaneously partially demagnetizing the magnetically biased first magnetic bias layer to provide a partially demagnetized magnetically biased first magnetic bias layer having a partially demagnetized first magnetic bias field strength less than a first magnetic bias field strength; and (2) a second thermal annealing method employing a second thermal annealing temperature and a second thermal annealing exposure time without a second magnetic bias field: (a) to form from the partially demagnetized magnetically biased first magnetic bias layer a remagnetized partially demagnetized first magnetic bias layer having a remagnetized partially demagnetized first magnetic bias field strength greater than the partially demagnetized first magnetic bias field strength; and (b) to form from the magnetically biased second magnetic bias layer a further magnetically biased second magnetic bias layer having a further magnetized second magnetic bias field strength greater than the second magnetic bias field strength.

The method of the present invention is readily commercially implemented. The method of the present invention employs thermal annealing methods which are generally known in the art of magnetoresistive (MR) sensor element fabrication. Since it is a process control within the present invention which provides at least in part the method of the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a non-parallel magnetically biased multiple magnetoresistive (MR) layer magnetoresistive (MR) sensor element, and a method for fabricating the non-parallel magnetically biased multiple magnetoresistive (MR) layer magnetoresistive (MR) sensor element, where the non-parallel magnetically biased multiple magnetoresistive (MR) layer magnetoresistive (MR) sensor element has an enhanced magnetic bias profile uniformity within a trackwidth of the non-parallel magnetically biased multiple magnetoresistive (MR) layer magnetoresistive (MR) sensor element. The method of the present invention realizes the foregoing objects by employing when forming the non-parallel magnetically biased multiple magnetoresistive (MR) layer magnetoresistive (MR) sensor element: (1) a first thermal annealing method employing a first thermal annealing temperature, a first thermal annealing exposure time and a first extrinsic magnetic bias field strength to form from a magnetically un-biased second magnetic bias layer a magnetically biased second magnetic bias layer having a second magnetic bias field strength in a second magnetic bias direction non-parallel to a first magnetic bias direction of a magnetically biased first magnetic bias layer while simultaneously partially demagnetizing the magnetically biased first magnetic bias layer to provide a partially demagnetized magnetically biased first magnetic bias layer having a partially demagnetized first magnetic bias field strength less than the first magnetic bias field strength; and (2) a second thermal annealing method employing a second thermal annealing temperature and a second thermal annealing exposure time without a second magnetic bias field: (a) to form from the partially demagnetized magnetically biased first magnetic bias layer a remagnetized partially demagnetized first magnetic bias layer having a remagnetized partially demagnetized first magnetic bias field strength greater than the partially demagnetized first magnetic bias field strength; and (b) to form from the magnetically biased second magnetic bias layer a further magnetically biased second magnetic bias layer having a further magnetized second magnetic bias field strength greater than the second magnetic bias field strength.

Although the preferred embodiment of the present invention illustrates the present invention within the context of fabricating within a merged inductive magnetic write dual stripe magnetoresistive (DSMR) read magnetic read-write head which is most likely to be employed within digitally encoded magnetic data storage and retrieval an anti-parallel magnetically biased dual stripe magnetoresistive (DSMR) sensor element, the method of the present invention may be employed in forming non-parallel magnetically biased multiple magnetoresistive (MR) layer magnetoresistive (MR) sensor elements other than only anti-parallel magnetically biased dual stripe magnetoresistive (DSMR) sensor elements. Such other non-parallel magnetically biased multiple magnetoresistive (MR) layer magnetoresistive (MR) sensor elements may include, but are not limited to, non-parallel magnetically biased dual stripe magnetoresistive (DSMR) sensor elements other than anti-parallel magnetically biased dual stripe magnetoresistive (DSMR) sensor elements and non-parallel magnetically biased multiple magnetoresistive (MR) layer magnetoresistive layer magnetoresistive (MR) sensor elements other than dual stripe magnetoresistive (DSMR) sensor elements. The latter category may include, but is not limited to a dual spin valve magnetoresistive (DSVMR) sensor element as is disclosed, for example and without limitation within Ohtsuka et al, within U.S. Pat. No. 5,859,753, as cited within the Description of the Related Art, the teachings of all of which related art are incorporated herein fully by reference.

Similarly, in a more fundamental sense, the present invention provides a method for at least partially remagnetizing a partially demagnetized magnetic bias layer which may be employed within a magnetoresistive (MR) sensor element, typically under circumstances where the partially demagnetized magnetic bias layer has been partially demagnetized incident to magnetically biasing an additional magnetic bias layer within the magnetoresistive (MR) sensor element or incident to some other demagnetizing incident experienced by the magnetoresistive (MR) sensor element. The magnetoresistive (MR) sensor element wherein the partially demagnetized magnetic bias layer may be remagnetized may be selected from the group including but not limited to single stripe magnetoresistive (SSMR) sensor elements, dual stripe magnetoresistive (DSMR) sensor elements, spin valve magnetoresistive (SVMR) sensor elements and dual spin valve magnetoresistive (DSVMR) sensor elements. See, e.g., Dovek et al., U.S. Pat. No. 5,650,887, as cited within the Description of the Related Art.

Finally, a non-parallel magnetically biased multiple magnetoresistive (MR) layer magnetoresistive (MR) sensor element fabricated in accord with the present invention may be employed within a magnetic sensor within magnetic sensor applications including but not limited to digital magnetic sensor applications and analog magnetic sensor applications employing magnetic heads including but not limited to merged inductive magnetic write magnetoresistive (MR) read magnetic read-write heads, non-merged inductive magnetic write magnetoresistive (MR) read magnetic read-write heads, and read only magnetoresistive (MR) read heads.

Figure 1:
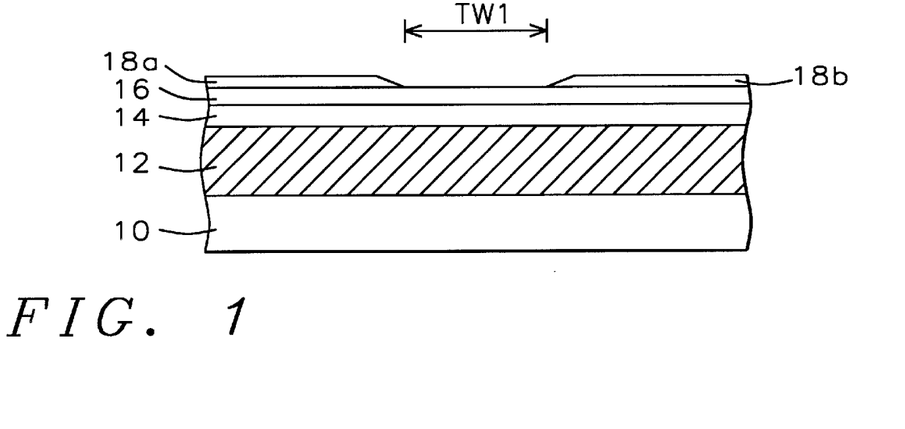
FIG. 1, FIG. 2, FIG. 3a, FIG. 3b, FIG. 4a, FIG. 4b, FIG. 5a, FIG. 5b and FIG. 6 show a series of schematic air bearing surface (ABS) view diagrams and schematic perspective view diagrams illustrating the results of progressive stages in forming a merged inductive magnetic write dual stripe magnetoresistive (DSMR) read magnetic read-write head having formed therein an anti-parallel magnetically biased dual stripe magnetoresistive (DSMR) sensor element in accord with a preferred embodiment of the present invention.

Referring now to FIG. 1 to FIG. 6, there is shown a series of schematic air bearing surface (ABS) view diagrams and schematic perspective view diagrams illustrating the results of progressive stages in fabrication of a merged inductive magnetic write dual stripe magnetoresistive (DSMR) read magnetoresistive (MR) sensor element having fabricated therein a nominally anti-parallel non-parallel longitudinally magnetically biased dual stripe magnetoresistive (DSMR) sensor element in accord a preferred embodiment of the present invention. Shown in FIG. 1 is a schematic air bearing surface (ABS) view diagram of the merged inductive magnetic write dual stripe magnetoresistive (DSMR) read magnetoresistive (MR) sensor element at an early stage in its fabrication in accord with the preferred embodiment of the present invention.

Shown in FIG. 1 is a substrate 10 having formed thereupon a blanket first shield layer 12 which in turn has formed thereupon a blanket first non-magnetic spacer layer 14. Within the preferred embodiment of the present invention with respect to the substrate 10, the blanket first shield layer 12 and the blanket first non-magnetic spacer layer 14, the substrate 10, the blanket first shield layer 12 and the blanket first non-magnetic spacer layer 14 may be formed employing methods and materials as are conventional in the art of magnetoresistive (MR) sensor element fabrication.

For example, although it is known in the art of magnetoresistive (MR) sensor element fabrication that substrates are typically formed from non-magnetic ceramic materials such as but not limited to oxides, nitrides, borides and carbides, as well as homogeneous and heterogeneous mixtures of oxides, nitrides, borides and carbides, for the preferred embodiment of the present invention, the substrate 10 is typically and preferably formed from a non-magnetic aluminum oxide/titanium carbide ceramic material. Preferably, the substrate 10 is formed with sufficient dimensions to allow the substrate 10 to be fabricated into a slider employed within a magnetic head employed within a direct access storage device (DASD) magnetic data storage enclosure employed within digitally encoded magnetic data storage and retrieval, although, as noted above, a magnetoresistive (MR) sensor element fabricated in accord with the present invention may be employed within other digital magnetic storage and transduction applications, as well as analog magnetic signal storage and transduction applications.

Similarly, although it is also known in the art of magnetoresistive (MR) sensor element fabrication that shield layers may be formed from any of several soft magnetic materials, including but not limited to nickel-iron permalloy alloy soft magnetic materials and higher order alloy soft magnetic materials incorporating nickel-iron permalloy alloy soft magnetic materials (ie: nickel-iron-rhodium soft magnetic materials and nickel-iron-chromium soft magnetic materials), for the preferred embodiment of the present invention, the blanket first shield layer 12 is preferably formed of a nickel-iron (80:20 w/w) permalloy alloy soft magnetic material. Typically and preferably, the blanket first shield layer 12 is formed to a thickness of from about 10000 to about 30000 angstroms.

Finally, within the preferred embodiment of the present invention with respect to the blanket first non-magnetic spacer layer 14, although the blanket first non-magnetic spacer layer 14 may be formed employing methods and materials as are conventional in the art of magnetoresistive (MR) sensor element fabrication, including but not limited to chemical vapor deposition (CVD) methods, plasma enhanced chemical vapor deposition (PECVD) methods and physical vapor deposition (PVD) sputtering methods through which may be formed non-magnetic spacer layers of non-magnetic spacer materials including but not limited to conductor non-magnetic spacer materials and dielectric non-magnetic spacer materials (such dielectric non-magnetic spacer materials including but not limited to silicon oxide dielectric materials, silicon nitride dielectric materials, nitrogenated carbon dielectric materials and aluminum oxide dielectric materials), for the preferred embodiment of the present invention, the blanket first non-magnetic spacer layer 14 is preferably formed of an aluminum oxide non-magnetic dielectric spacer material deposited employing a physical vapor deposition (PVD) sputtering method, as is most common in the art of magnetoresistive (MR) sensor element fabrication. Preferably, the blanket first non-magnetic spacer layer 14 so formed is formed to a thickness of from about 100 to about 500 angstroms.

Although not completely illustrated within the schematic air-bearing surface (ABS) view diagram of FIG. 1, there is also shown within FIG. 1 formed upon the blanket first non-magnetic spacer layer 14 a patterned first magnetoresistive (MR) layer 16. Typically and preferably, the patterned first magnetoresistive (MR) layer 16 is formed from a magnetoresistive (MR) material analogous or equivalent to the soft magnetic material employed for forming the blanket first shield layer 12. Preferably, the patterned first magnetoresistive (MR) layer 16 is formed upon the blanket first non-magnetic spacer layer 14 from a nickel-iron (80:20; w/w) permalloy alloy magnetoresistive material to a thickness of from about 50 to about 200 angstroms, a length (i.e. long axis or "easy" axis) of from about 0.3 to about 5 microns and a width (i.e. short axis of "hard" axis) of from about 0.3 to about 1.0 microns.

Finally, there is also shown within the schematic air-bearing surface (ABS) view diagram of FIG. 1 a pair of magnetically un-biased patterned first longitudinal magnetic bias layers 18a and 18b formed upon a pair of opposite ends of the long axis of the patterned first magnetoresistive (MR) layer 16 to define a first trackwidth TW1 of the patterned first magnetoresistive (MR) layer 16. Preferably, the first trackwidth TW1 is from about 0.1 to about 3 microns. The pair of magnetically un-biased patterned first longitudinal magnetic bias layers 18a and 18b may be formed of longitudinal magnetic bias materials as are known in the art of magnetoresistive (MR) sensor element fabrication, including but not limited to: (1) antiferromagnetic longitudinal magnetic bias materials (such as but not limited to iron-manganese alloy longitudinal magnetic biasing materials, nickel-manganese longitudinal magnetic biasing materials, iridium-manganese alloy longitudinal magnetic biasing materials, platinum-manganese alloy longitudinal magnetic biasing materials, platinum-palladium-manganese alloy longitudinal magnetic biasing materials and additional related and higher order alloys thereof), as well as; (2) permanent magnet longitudinal magnetic bias materials (such as but not limited to platinum-cobalt alloy longitudinal magnetic biasing materials, higher order alloys incorporating platinum-cobalt alloy longitudinal magnetic biasing materials, cobalt-chromium alloy longitudinal magnetic biasing materials and rare earth alloy longitudinal magnetic biasing materials). Preferably, each of the magnetically un-biased patterned first longitudinal magnetic bias layers 18a and 18b is formed of an antiferromagnetic longitudinal magnetic bias material, preferably a nickel-manganese alloy (50:50, w/w) antiferromagnetic longitudinal magnetic bias material, preferably to a thickness of from about 100 to about 300 angstroms each.

Although not illustrated within the schematic air bearing surface (ABS) view diagram of FIG. 1, there is typically and preferably also formed coextensively upon the pair of magnetically un-biased patterned first longitudinal magnetic bias layers 18a and 18b a pair of patterned first conductor lead layers. Illustration of the pair of patterned first conductor lead layers is omitted from the schematic air bearing surface (ABS) view diagram of FIG. 1, in order to provide clarity. Typically and preferably, the pair of patterned first conductor lead layers may be formed simultaneously with the pair of magnetically un-biased patterned first longitudinal magnetic bias layers 18a and 18b while employing a lift-off method. Typically and preferably, each patterned first conductor lead layer within the pair of patterned first conductor lead layers is formed to a thickness of from about 500 to about 1000 angstroms while employing a conductor lead material conventional in the art of magnetoresistive (MR) sensor element fabrication, such a conductor lead material being selected from the group of conductor lead materials including but not limited to aluminum, aluminum alloy, copper, copper alloy, tungsten, tungsten alloy, tantalum, tantalum alloy, gold and gold alloy conductor lead materials, as well as laminates thereof Finally, although the schematic air-bearing surface (ABS) view diagram of FIG. 1 illustrates the pair of magnetically unbiased patterned first longitudinal magnetic bias layers 18a and 18b formed upon the patterned first magnetoresistive layer 16, it is also feasible within the present invention that a pair of magnetically un-biased or magnetically biased patterned first longitudinal magnetic biasing layers, analogous to the pair of magnetically unbiased patterned first longitudinal magnetic bias layers 18a and 18b, either abuts or is formed beneath a patterned first magnetoresistive (MR) layer, such as the patterned first magnetoresistive (MR) layer 16, provided that the pair of magnetically un-biased or magnetically biased patterned first longitudinal magnetic bias layers contacts a pair of opposite ends of the patterned first magnetoresistive (NM) layer to define a first trackwidth of the patterned first magnetoresistive (MR) layer.

Figure 2:
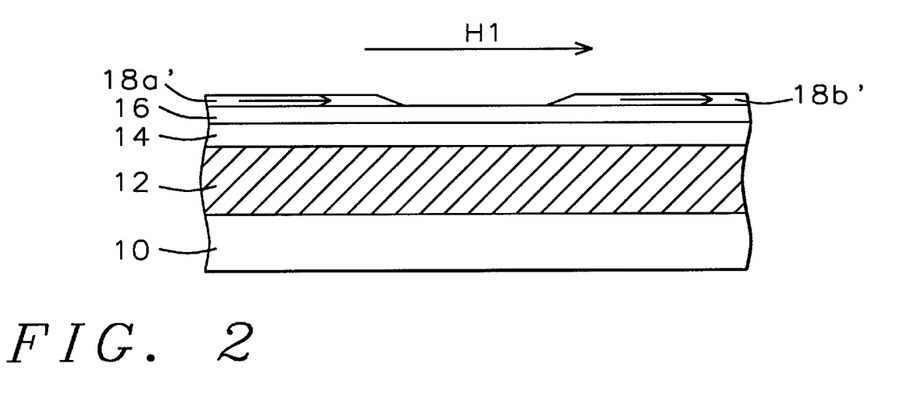

Referring now to FIG. 2, there is shown a schematic air bearing surface (ABS) view diagram illustrating the results of further processing of the merged inductive magnetic write dual stripe magnetoresistive (DSMR) read magnetoresistive (MR) sensor element whose schematic air bearing surface (ABS) view diagram is illustrated in FIG. 1. Shown in FIG. 2 is a schematic air bearing surface (ABS) view diagram of a merged inductive magnetic write dual stripe magnetoresistive (DSMR) read magnetoresistive (MR) sensor element otherwise equivalent to the inductive magnetic write dual stripe magnetoresistive (DSMR) read magnetoresistive (MR) sensor element whose schematic cross-sectional diagram is illustrated in FIG. 1, but wherein the magnetically un-biased patterned first longitudinal magnetic bias layers 18a and 18b are longitudinally magnetically biased by thermal annealing within a first thermal annealing method under the influence of a first extrinsic magnetic bias field HI to longitudinally magnetically bias the pair of magnetically un-biased patterned first longitudinal magnetic bias layers 18a and 18b in a direction substantially parallel with an axis which separates the pair of magnetically un-biased patterned first longitudinal magnetic bias layers 18a and 18b, thus forming from the pair of magnetically un-biased patterned first longitudinal magnetic bias layers 18a and 18b a pair of magnetically biased patterned first longitudinal magnetic biasing layers 18a' and 18b'.

Although the preferred embodiment of the present invention illustrates the longitudinal magnetic biasing of the pair of magnetically un-biased patterned first longitudinal magnetic bias layers 18a and 18b to form the pair of magnetically biased patterned first longitudinal magnetic bias layers 18a' and 18b' by employing the first extrinsic magnetic bias field H1 while employing the first thermal annealing method after forming the pair of magnetically un-biased patterned first longitudinal magnetic bias layers 18a and 18b, it is also feasible within the method of the present invention that the magnetically biased patterned first longitudinal magnetic bias layers 18a' and 18b' may be formed directly incident to forming the otherwise magnetically un-biased patterned first longitudinal magnetic biasing layers 18a and 18b within the first extrinsic magnetic bias field H1 when originally forming the pair of otherwise magnetically un-biased patterned first longitudinal magnetic bias layers 18a and 18b.

Within the preferred embodiment of the present invention, the magnetically biased patterned first longitudinal magnetic bias layers 18a' and 18b' are preferably formed employing the first thermal annealing method wherein the inductive magnetic write dual stripe magnetoresistive (DSMR) read magnetoresistive (MR) sensor element whose schematic air bearing surface (ABS) view diagram is illustrated in FIG. 1 is thermally annealed within the first extrinsic magnetic bias field H1 of strength from about 500 to about 2000 oersteds for a time period of from about 5 to about 10 hours and a temperature of about 280 to about 300 degrees centigrade, under circumstances where the magnetically un-biased patterned first longitudinal magnetic bias layers 18a and 18b are each formed of a nickel-manganese (50:50; w/w) anti-ferromagnetic longitudinal magnetic bias material as is conventional in the art of magnetoresistive (MR) sensor element fabrication. Under such first thermal annealing conditions, it is expected that the pair of magnetically biased patterned first longitudinal magnetic bias layers 18a' and 18b' is fully magnetically saturated in a first magnetic bias direction with a first magnetic bias field strength. More preferably, and although not specifically illustrated within the schematic cross-sectional diagram of FIG. 2, the magnetically biased patterned first longitudinal magnetic bias layers 18a' and 18b' are preferably formed employing the first thermal annealing method wherein the merged inductive write dual stripe magnetoresistive (DSMR) read magnetoresistive (MR) sensor element whose schematic cross-sectional diagram is illustrated in FIG. 1, but over which is formed a patterned second magnetoresistive (MR) layer, is thermally annealed while employing the first thermal annealing method employing the first extrinsic magnetic bias field H1 employing the above recited thermal annealing conditions. Under such circumstances, the patterned first magnetoresistive (MR) layer 16 and the patterned second magnetoresistive (MR) layer will typically, incident to their simultaneous thermal annealing, have correlating resistance and magnetoresistance (MR) properties.

Although the schematic air-bearing surface (ABS) view diagram of FIG. 2 implicitly illustrates the magnetically biased patterned first longitudinal magnetic biasing layers 18a' and 18b' as nominally completely aligned with a major axis which separates the pair of magnetically biased patterned first longitudinal magnetic bias layers 18a' and 18b', it is understood by a person skilled in the art that the magnetically biased patterned first longitudinal magnetic bias layers 18a' and 18b' will typically and preferably be only substantially aligned with an acute divergent angle of up to about 60 degrees, and more preferably from about 30 to about 50 degrees, from the major axis of complete alignment. Such substantial alignment is typical incident to thermal annealing methods and magnetically assisted deposition methods as are conventional in the art of magnetoresistive (MR) sensor element fabrication, and such substantial alignment, rather than complete alignment, provides optimal magnetoresistive (MR) properties to a dual stripe magnetoresistive (DSMR) sensor element.

Figure 3A:
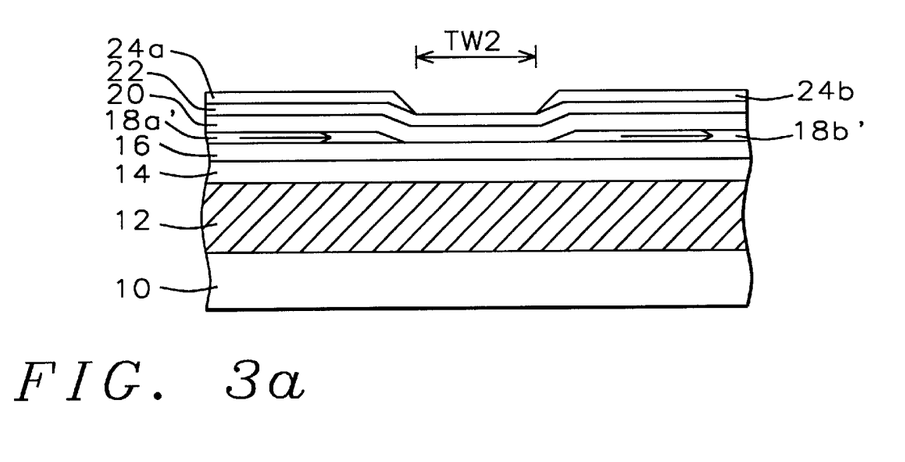

Referring now to FIG. 3a, there is shown a schematic air bearing surface (ABS) view diagram illustrating the results of further processing of the merged inductive magnetic write dual stripe magnetoresistive (DSMR) read magnetoresistive (MR) sensor element whose schematic air bearing surface (ABS) view diagram is illustrated in FIG. 2. Shown in FIG. 3a is a schematic air bearing surface (ABS) view diagram of a merged inductive magnetic write dual stripe magnetoresistive (DSMR) read magnetoresistive (MR) sensor element otherwise equivalent to the merged inductive magnetic write dual stripe magnetoresistive (MR) read magnetoresistive (MR) sensor element whose schematic air bearing surface (ABS) view diagram is illustrated in FIG. 2 but wherein: (1) there is formed upon the pair of magnetically biased patterned first longitudinal magnetic biasing layers 18a' and 18b' and upon the first trackwidth TW1 of the patterned first magnetoresistive (MR) layer 16 a blanket second non-magnetic spacer layer 20; (2) there is formed upon the blanket second non-magnetic spacer layer 20 a patterned second magnetoresistive layer 22; and (3) there is formed upon the patterned second magnetoresistive (MR) layer 22 a pair of magnetically un-biased patterned second longitudinal magnetic bias layers 24a and 24b which define a second trackwidth TW2 of the patterned second magnetoresistive (MR) layer 22. Preferably, the second trackwidth TW2 is of a width and alignment corresponding with the first trackwidth TW1. It is further noted that the patterned first magnetoresistive (MR) layer 16 and the patterned second magnetoresistive (MR) layer 22 may each also be a magnetoresistive sensor structure such as a spin-valve magnetoresistive (SVMR) sensor structure which is well known in the art and is described in detail within the prior art of Dovek et al. and Ohtsuka et al. (cited above), both of which are fully incorporated herein by reference. If layers 16 and 22 are SVMR structures, the sensor so endowed will be a dual spin-valve magnetoresistive (DSMVR) sensor rather than a dual stripe magnetoresistive (DSMR) sensor.

Within the preferred embodiment of the present invention, the blanket second non-magnetic spacer layer 20 is preferably formed employing methods and materials analogous or equivalent to the methods and materials preferably employed for forming the blanket first non-magnetic spacer layer 14. Typically and preferably, the blanket second non-magnetic spacer layer 20 is formed of an aluminum oxide non-magnetic dielectric spacer material formed to a thickness of from about 200 to about 500 angstroms. Similarly, within the preferred embodiment of the present invention, the patterned second magnetoresistive layer 22 is preferably formed employing methods, materials and dimensions analogous or equivalent to the methods, materials and dimensions employed for forming the patterned first magnetoresistive layer 16. Finally, within the preferred embodiment of the present invention, the pair of magnetically un-biased patterned second longitudinal magnetic bias layers 24a and 24b is preferably formed employing methods, materials and dimensions analogous or equivalent to the methods, materials and dimensions employed for forming the pair of magnetically un-biased patterned first longitudinal magnetic bias layers 18a and 18b. In particular, the pair of magnetically un-biased patterned second longitudinal magnetic bias layers 24a and 24b and the pair of magnetically un-biased patterned first longitudinal magnetic bias layers 18a and 18b are preferably but not necessarily formed of a single longitudinal magnetic biasing material. Analogously with the magnetically un-biased patterned first longitudinal magnetic biasing layers 18a and 18b, and similarly also not illustrated within the schematic air bearing surface (ABS) view diagram of FIG. 3a, the pair of magnetically un-biased patterned second longitudinal magnetic bias layers 24a and 24b also preferably has formed and aligned thereupon, while similarly also preferably employing a lift off method, a pair of patterned second conductor lead layers formed employing materials and dimensions analogous or equivalent to the materials and dimensions employed for forming the pair of patterned first conductor lead layers.

Figure 3B:
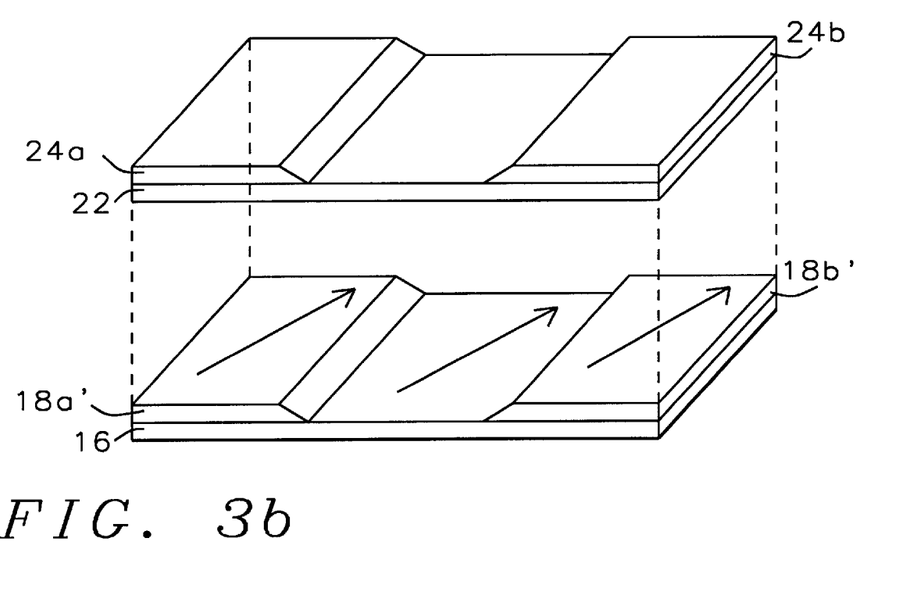

Referring now to FIG. 3b, there is shown a schematic perspective view diagram corresponding with the schematic cross-sectional diagram of FIG. 3a. Shown in FIG. 3b is the patterned first magnetoresistive (MR) layer 16 having formed upon a pair of its opposite ends the pair of magnetically biased patterned first longitudinal magnetic bias layers 18a' and 18b' which are preferably formed fully saturated in a first magnetic bias direction with a first magnetic bias field strength. Similarly, there is also shown within FIG. 3b the patterned second magnetoresistive (MR) layer 22 having formed and aligned thereupon the pair of magnetically un-biased patterned second longitudinal magnetic bias layers 24a and 24b. All other layers within the merged inductive magnetic write dual stripe magnetoresistive (DSMR) read magnetoresistive (MR) sensor element whose schematic air bearing surface (ABS) view diagram is illustrated in FIG. 3a have been omitted for clarity.

Figure 4A:
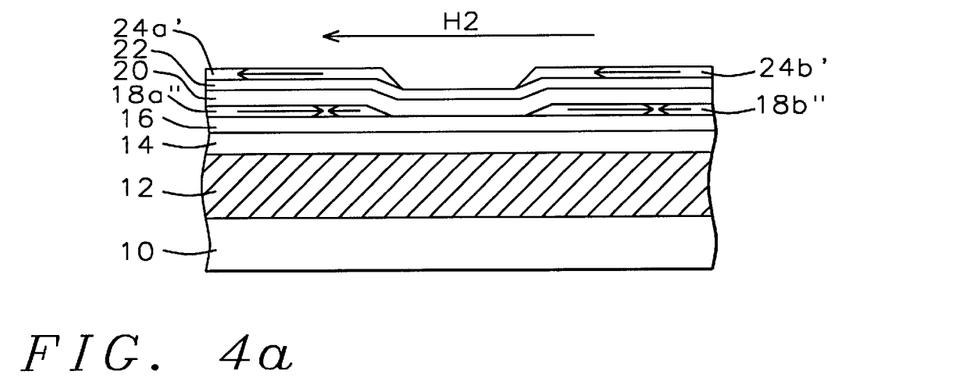

Referring now to FIG. 4a, there is shown a schematic air bearing surface (ABS) view diagram illustrating the results of further processing of the merged inductive magnetic write dual stripe magnetoresistive (DSMR) read magnetoresistive (MR) sensor element whose schematic air bearing surface (ABS) view diagram is illustrated in FIG. 3a. Shown in FIG. 4a is a schematic air bearing surface (ABS) view diagram of a merged inductive magnetic write dual stripe magnetoresistive (DSMR) read magnetoresistive (MR) sensor element otherwise equivalent to the merged inductive magnetic write dual stripe magnetoresistive (DSMR) read magnetoresistive (MR) sensor element whose schematic air bearing surface (ABS) view diagram is illustrated in FIG. 3a, but wherein the magnetically un-biased patterned second longitudinal magnetic biasing layers 24a and 24b have been longitudinally magnetically biased while employing a second thermal annealing method employing a second extrinsic magnetic bias field H2 nominally anti-parallel to the first extrinsic magnetic bias field H1 as illustrated within the schematic air bearing surface (ABS) view diagram of FIG. 2, to provide the magnetically biased patterned second longitudinal magnetic bias layers 24a' and 24b'.

Within the preferred embodiment of the present invention, the magnetically un-biased patterned second longitudinal magnetic bias layers 24a and 24b are longitudinally magnetically biased substantially nominally anti-parallel with respect to the magnetically biased patterned first longitudinal magnetic biasing layers 18a' and 18b' as illustrated in FIG. 2, while employing the second thermal annealing method which employs a second thermal annealing temperature and a second thermal annealing exposure time, in conjunction with the second extrinsic magnetic bias field H2 of appropriate magnetic field strength, such that the pair of magnetically un-biased patterned second longitudinal magnetic biasing layers 24a and 24b is longitudinally magnetically biased to form the pair of magnetically biased patterned second longitudinal magnetic bias layers 24a' and 24b' while substantially but not completely de-magnetizing the pair of magnetically biased patterned first longitudinal magnetic bias layers 18a' and 18b' which then form a pair of partially demagnetized magnetically biased patterned first longitudinal magnetic bias layers 18a" and 18b", as illustrated within the schematic air bearing surface (ABS) view diagram of FIG. 4a.

For the preferred embodiment of the present invention when both the pair of magnetically biased patterned first longitudinal magnetic bias layers 18a' and 18b', as well as the pair of magnetically un-biased patterned second longitudinal magnetic bias layers 24a and 24b, are formed of a nickel-manganese alloy (50:50, w/w) antiferromagnetic longitudinal magnetic bias material, the pair of magnetically un-biased patterned second longitudinal magnetic biasing layers 24a and 24b is preferably thermally annealed at the second thermal annealing temperature of from about 250 to about 275 degrees centigrade for a second thermal annealing exposure time period of from about 0.5 to about 1.5 hours within the second extrinsic magnetic bias field H2 of strength about 1000 to about 2000 oersteds. Preferably, each of the first thermal annealing method and the second thermal annealing method also employs a nitrogen atmosphere.

Within the present invention, it is preferred that the pair of magnetically biased patterned first longitudinal magnetic bias layers 18a' and 18b' be substantially demagnetized when forming the pair of partially demagnetized patterned first longitudinal magnetic bias layers 18a" and 18b" to provide the pair of partially demagnetized patterned first longitudinal magnetic bias layers with a partially demagnetized first magnetic bias field strength of no less than about 25 to about 30 percent (more preferably from about 30 to about 50 percent) of the first magnetic bias field strength, while still maintaining the first magnetic bias field direction, when forming the pair of partially demagnetized magnetically biased patterned first longitudinal magnetic bias layers 18a" and 18b" incident to forming the pair of magnetically biased patterned second longitudinal magnetic bias layers 24a' and 24b' from the pair of magnetically unbiased patterned second longitudinal magnetic bias layers 24a and 24b. Thus, within the present invention, there is balanced at an appropriate second thermal annealing temperature, second thermal annealing exposure time and second extrinsic magnetic bias field H2 strength a magnetization of the pair of magnetically un-biased patterned second longitudinal magnetic bias layers 24a and 24b in comparison with a demagnetization of the pair of magnetically biased patterned first longitudinal magnetic bias layers 18a' and 18b'.

Similarly, although not specifically illustrated within the preferred embodiment of the present invention, within the present invention, generally, the extrinsic first magnetic bias field H1 and the extrinsic second magnetic bias field H2 need only be non-parallel, rather than anti-parallel.

Figure 4B:
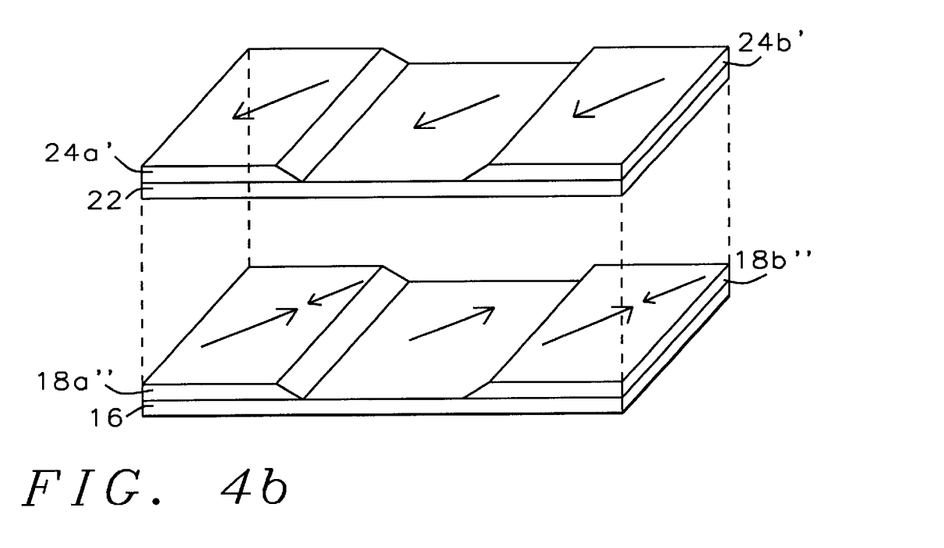

Referring now to FIG. 4b, there is shown a schematic perspective view diagram corresponding with the schematic cross-sectional diagram of FIG. 4a. Shown in FIG. 4b is the patterned first magnetoresistive (MR) layer 16 having formed upon a pair of its opposite ends the pair of partially demagnetized magnetically biased patterned first longitudinal magnetic bias layers 18a" and 18b". Similarly, there is also shown within FIG. 4b the patterned second magnetoresistive layer 22 having formed and aligned upon a pair of its opposite ends the pair of magnetically biased patterned second longitudinal magnetic bias layers 24a' and 24b'. As is illustrated within the schematic perspective view diagram of FIG. 4b, the pair of magnetically biased patterned second longitudinal magnetic biasing layers 24a' and 24b' is partially magnetized while the pair of partially demagnetized magnetically biased patterned first longitudinal magnetic bias layers 18a" and 18b" is not completely demagnetized. All other layers within the merged inductive magnetic write dual stripe magnetoresistive (DSMR) read magnetoresistive (MR) sensor element whose schematic air bearing surface (ABS) view diagram is illustrated in FIG. 4a have been omitted for clarity.

Similarly, although both FIG. 4a and FIG. 4b illustrate the results of the second thermal annealing method for forming the pair of magnetically biased patterned second longitudinal magnetic biasing layers 24a' and 24b' as occurring immediately after forming the pair of magnetically unbiased patterned second longitudinal magnetic biasing layers 24a and 24b upon the patterned second magnetoresistive (MR) layer 22, within the method of the present invention, the second thermal annealing may often preferably be undertaken at a later stage in processing of the merged inductive magnetic write dual stripe magnetoresistive (DSMR) read magnetoresistive (MR) sensor element whose schematic air bearing surface (ABS) view diagram is illustrated in FIG. 4a and whose schematic perspective view diagram is illustrated in FIG. 4b. For example, and without limitation, the second thermal annealing may be undertaken after write element structures are formed within the merged inductive magnetic write dual stripe magnetoresistive (DSMR) read magnetoresistive (MR) sensor element whose schematic air bearing surface (ABS) view diagram is illustrated in FIG. 4a and whose schematic perspective view diagram is illustrated in FIG. 4b. Under such circumstances, the second thermal annealing may, for example, thermally anneal and stabilize a magnetic write pole layer and a magnetic write coil layer.

Figure 5A:
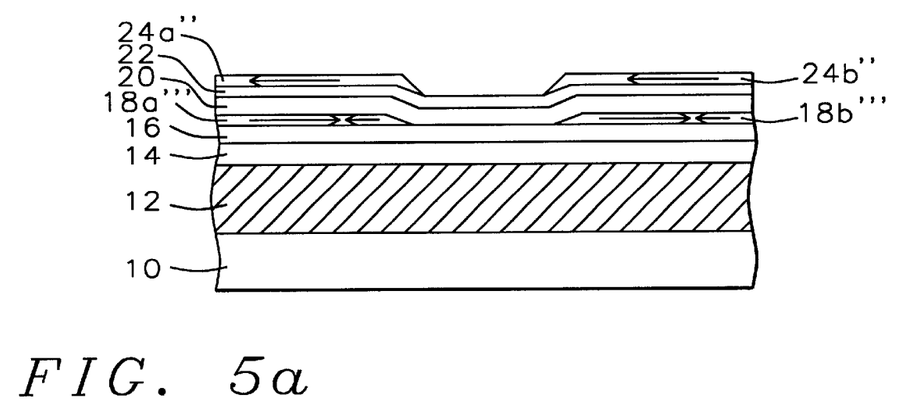

Referring now to FIG. 5a, there is shown a schematic air bearing surface (ABS) view diagram illustrating the results of further processing of the merged inductive magnetic write dual stripe magnetoresistive (DSMR) read magnetoresistive (MR) sensor element whose schematic air bearing surface (ABS) view diagram is illustrated in FIG. 4a.

Shown in FIG. 5a is a schematic air bearing surface (ABS) view diagram of a merged inductive magnetic write dual stripe magnetoresistive (DSMR) read magnetoresistive (MR) sensor element otherwise equivalent to the merged inductive magnetic write dual stripe magnetoresistive (DSMR) read magnetoresistive (MR) sensor element whose schematic air bearing surface (ABS) view diagram is illustrated in FIG. 4a, but wherein the merged inductive magnetic write dual stripe magnetoresistive (DSMR) read magnetoresistive (MR) sensor element has been thermally annealed while employing a third thermal annealing method employing a third thermal annealing temperature and a third thermal annealing exposure time without a third extrinsic magnetic bias field to: (1) form from the partially demagnetized magnetically biased patterned first longitudinal magnetic bias layers 18a" and 18b" a corresponding pair of remagnetized partially demagnetized magnetically biased patterned first longitudinal magnetic bias layers 18'" and 18b'" having a remagnetized partially demagnetized first magnetic bias field strength in the first magnetic bias direction and greater than the partially demagnetized first magnetic bias field strength; and (2) form from the pair of magnetically biased patterned second longitudinal magnetic bias layers 24a' and 24b' a pair of further magnetically biased patterned second longitudinal magnetic bias layers 24a" and 24b" having a further magnetized second magnetic bias field strength in the second magnetic bias direction and greater than the second magnetic bias field strength.

Within the preferred embodiment of the present invention with respect to the third thermal annealing method, the third thermal annealing method preferably employs a third thermal annealing temperature of at least about 250 degrees centigrade and preferably from about 250 to about 300 degrees centigrade and a third thermal exposure time of at least about 3 hours, preferably from about 4 to about 10 hours.

Figure 5B:
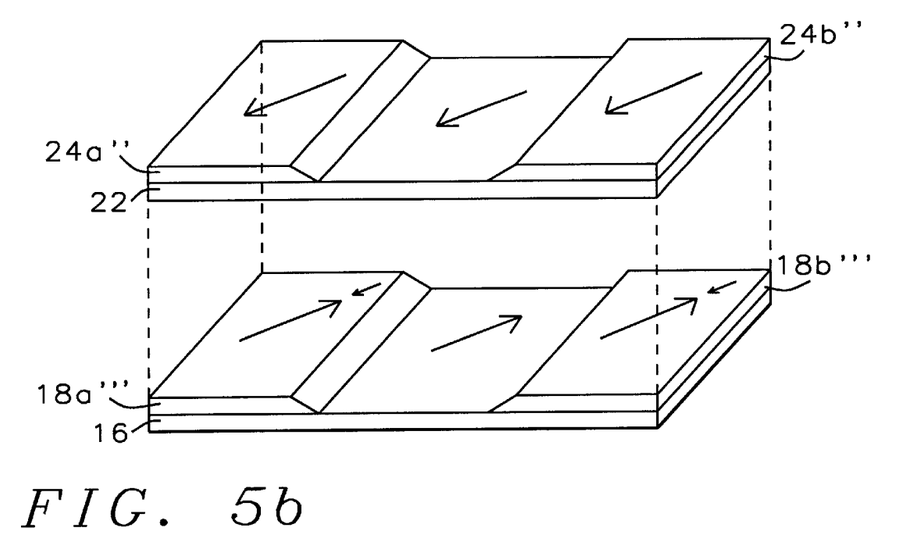

Referring now to FIG. 5b, there is shown a schematic perspective view diagram corresponding with the schematic air bearing surface (ABS) view diagram of FIG. 5a. Shown in FIG. 5b is the patterned first magnetoresistive (MR) layer 16 having formed upon a pair of its opposite ends the pair of remagnetized partially demagnetized magnetically biased patterned first longitudinal magnetic bias layers 18a'" and 18b'". Similarly, there is also shown within FIG. 5b the patterned second magnetoresistive layer 22 having formed and aligned upon a pair of its opposite ends the pair of further magnetically biased patterned second longitudinal magnetic bias layers 24a''' and 24b'''41. As is illustrated within the schematic perspective view diagram of FIG. 5b, the pair of remagnetized partially demagnetized magnetically biased patterned first longitudinal magnetic bias layers 18a''' and 18b''' is remagnetized with a remagnetized partially demagnetized first magnetic bias field strength in the first magnetic bias direction and greater than the partially demagnetized first magnetic bias field strength of the pair of partially demagnetized magnetically biased patterned first longitudinal magnetic bias layers 18a'' and 18b'' as is illustrated in the schematic perspective view diagram of FIG. 4b. Similarly, the further magnetically biased patterned second longitudinal magnetic bias layers 24a'' and 24b'' are, as illustrated within the schematic perspective view diagram of FIG. 5b, further magnetized in the second magnetic bias direction with a further magnetized second magnetic bias field strength greater than the second magnetic bias field strength of the pair of magnetically biased patterned second longitudinal magnetic bias layers 24a' and 24b' as illustrated within the schematic perspective view diagram of FIG. 4b. All other layers within the merged inductive magnetic write dual stripe magnetoresistive (DSMR) read magnetoresistive (MR) sensor element whose schematic air bearing surface (ABS) view diagram is illustrated in FIG. 5a have been omitted for clarity.

Figure 6:
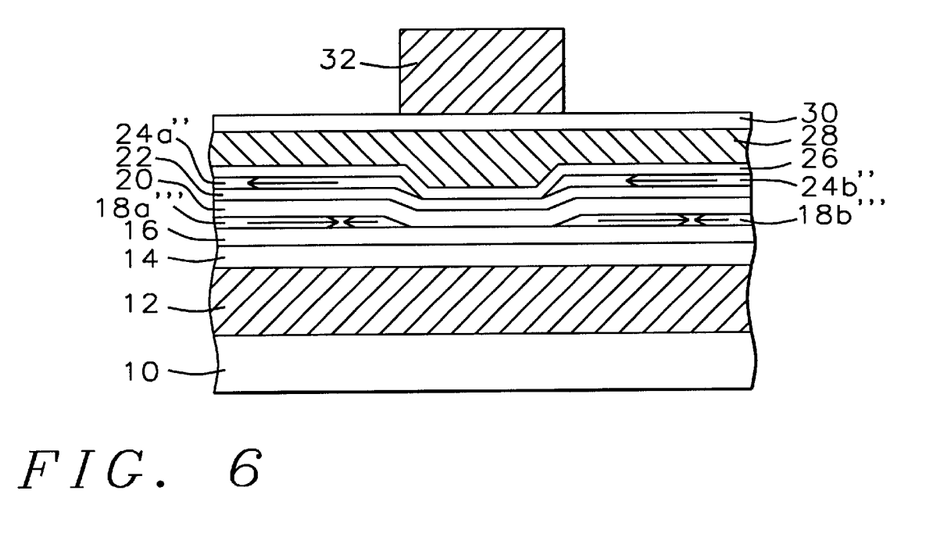

Referring now to FIG. 6, there is shown a schematic air bearing surface (ABS) view diagram illustrating the results of further processing of the merged inductive magnetic write dual stripe magnetoresistive (MR) read magnetoresistive (MR) sensor element whose schematic air bearing surface (ABS) view diagram is illustrated in FIG. 5a.

Shown in FIG. 6 is a schematic air bearing surface (ABS) view diagram of a merged inductive magnetic write dual stripe magnetoresistive (DSMR) read magnetoresistive (MR) sensor element otherwise equivalent to the merged inductive magnetic write dual stripe magnetoresistive (DSMR) read magnetoresistive (MR) sensor element whose schematic air bearing surface (ABS) view diagram is illustrated in FIG. 5a, but wherein: (1) there is formed upon the pair of further magnetically biased patterned second longitudinal magnetic bias layers 24a'' and 24b'' and the second trackwidth TW2 of the patterned second magnetoresistive layer 22 a blanket third non-magnetic spacer layer 26; (2) there is formed upon the blanket third non-magnetic spacer layer 26 a blanket second shield layer 28 which simultaneously serves as a blanket first magnetic inductor write pole layer; (3) there is formed upon the blanket second shield layer 28 a blanket fourth non-magnetic write gap filling spacer layer 30; and (4) there is formed upon the blanket fourth non-magnetic write gap filling spacer layer 30 a patterned second magnetic inductor write pole layer 32.

Within the preferred embodiment of the present invention, the blanket third non-magnetic spacer layer 26 is preferably formed employing methods, materials and dimensions analogous or equivalent to the methods, materials and dimensions employed for forming the blanket first non-magnetic spacer layer 14. Similarly, within the preferred embodiment of the present invention the blanket second shield layer 28 is preferably formed employing methods, materials and dimensions analogous or equivalent to the methods, materials and dimensions employed for forming the blanket first shield layer 12. Yet similarly, for the preferred embodiment of the present invention, the blanket fourth non-magnetic write gap filling spacer layer 30 is preferably formed employing methods and materials analogous or equivalent to the methods and materials employed for forming the blanket third non-magnetic spacer layer 26, the blanket second non-magnetic spacer layer 20 and the blanket first non-magnetic spacer layer 14. Preferably, the blanket fourth non-magnetic write gap filling spacer layer 30 is formed to a thickness of from about 500 to about 3000 angstroms of an aluminum oxide non-magnetic dielectric spacer material. Finally, within the preferred embodiment of the present invention, the patterned second magnetic inductor write pole layer 32 is preferably formed employing methods materials and thickness dimensions analogous or equivalent to the methods, materials and thickness dimensions employed for forming the blanket second shield layer 28, but of a narrower width dimension in the range of from about 0.1 to about 3 microns to correspond with the first trackwidth TW1 of the patterned first magnetoresistive layer 16 and the second trackwidth TW2 of the patterned second magnetoresistive (MR) layer 22.

Upon forming the merged inductive magnetic write dual stripe magnetoresistive (DSMR) read magnetoresistive (MR) sensor element whose schematic air bearing surface (ABS) view diagram is illustrated in FIG. 6, there is formed a merged inductive magnetic write dual stripe magnetoresistive (DSMR) read magnetoresistive (MR) sensor element with enhanced magnetic bias profile uniformity within the trackwidth of the merged inductive magnetic write dual stripe magnetoresistive (DSMR) read magnetoresistive (MR) sensor element. The merged inductive magnetic write dual stripe magnetoresistive (DSMR) read magnetoresistive (MR) sensor element of the present invention realizes the foregoing object by employing an anti-parallel longitudinal magnetic biasing of two pair of patterned longitudinal magnetic biasing layers which longitudinally magnetically bias a pair of patterned magnetoresistive (MR) layers within the merged inductive magnetic write dual stripe magnetoresistive (DSMR) read magnetoresistive (MR) sensor element. The two of pair patterned longitudinal magnetic biasing layers are preferably although not necessarily formed of a single longitudinal magnetic biasing material. Similarly, the method of the present invention employs when forming a pair of magnetically biased patterned second longitudinal magnetic bias layers upon a patterned second magnetoresistive (MR) layer a two step thermal annealing method comprising: (1) a first thermal annealing method employing a first thermal annealing temperature, a first thermal annealing exposure time and a first an extrinsic magnetic bias field strength such that a pair of magnetically un-biased patterned second longitudinal magnetic bias layers is longitudinally magnetically biased while de-magnetizing a pair of magnetically biased patterned first longitudinal magnetic bias layers which longitudinally magnetically bias a patterned first magnetoresistive (MR) layer in a direction anti-parallel to the patterned second magnetoresistive (MR) layer; and (2) a second thermal annealing method employing a second thermal annealing temperature and a second thermal annealing exposure time without a second extrinsic magnetic bias field to further magnetize the pair of magnetically biased patterned second magnetic bias layers when forming a pair of further magnetically biased patterned second magnetic bias layers and remagnetize the pair of partially demagnetized magnetically biased patterned first longitudinal magnetic bias layers when forming a pair of remagnetized partially demagnetized patterned first longitudinal magnetic bias layers.

EXAMPLE

In order to illustrate the value and operation of the present invention, there was fabricated a non-parallel anti-parallel longitudinally magnetically biased dual stripe magnetoresistive (DSMR) sensor element in accord with the preferred embodiment of the present invention. The anti-parallel longitudinally magnetically biased dual stripe magnetoresistive (DSMR) sensor element employed a patterned first magnetoresistive (MR) layer and a patterned second magnetoresistive (MR) layer each formed of a nickel-iron (80:20; w/w) permalloy magnetoresistive (MR) material formed to a thickness of about 100 angstroms, a length (long axis) of about 0.8 microns and a width (short axis) of about 0.4 microns, where the patterned first magnetoresistive (MR) layer had formed upon a pair of its opposite ends separated by the long axis a pair of magnetically un-biased patterned first longitudinal magnetic bias layers and the patterned second magnetoresistive (MR) layer had formed upon a pair of its opposite ends separated by the long axis a pair of magnetically un-biased patterned second longitudinal magnetic bias layers. Both the pair of magnetically un-biased patterned first longitudinal magnetic bias layers and the pair of magnetically un-biased pattern ed second longitudinal magnetic bias layers were formed of a nickel-manganese (50:50; w/w) antiferromagnetic longitudinal magnetic bias material formed to a thickness of about 300 angstroms and positioned to provide a trackwidth of the patterned first magnetoresistive (MR) layer or the patterned second magnetoresistive (MR) layer of about 0.8 microns.

In accord with the preferred embodiment of the present invention, the pair of magnetically un-biased patterned first longitudinal magnetic bias layers was magnetically biased to form therefrom a pair of magnetically biased patterned first longitudinal magnetic bias layers prior to forming upon the patterned second magnetoresistive (MR) layer the pair of magnetically un-biased patterned second longitudinal magnetic bias layers, through thermal annealing while employing a first thermal annealing method employing a first thermal annealing temperature of about 300 degrees centigrade, a first thermal annealing exposure time of about 8 hours and a first magnetic bias field strength of about 2000 oersteds directed at an acute angle of about 30 degrees with respect to the long (i.e. easy) axis of either the patterned first magnetoresistive (MR) layer or the patterned second magnetoresistive (MR) layer. After the first thermal annealing, measurements of: (1) an exchange bias field, Hex, between the patterned first magnetoresistive (MR) layer and the magnetically biased patterned first longitudinal magnetic bias layers; and (2) coercivity field, Hc, of the patterned first magnetoresistive (MR) layer were obtained employing methods as are conventional in the art of magnetoresistive (MR) sensor element fabrication.

After forming the pair of magnetically un-biased patterned second longitudinal magnetic bias layers upon the pair of opposite ends of the patterned second magnetoresistive (MR) layer, there was then thermally annealed the dual stripe magnetoresistive (DSMR) sensor element while employing a second thermal annealing method which employed a second thermal annealing temperature of about 270 degrees centigrade, a second thermal annealing exposure time of about 0.5 hours and a second extrinsic magnetic bias field strength of about 2000 oersteds directed anti-parallel to the first extrinsic magnetic bias field direction, which second thermal annealing: (1) partially demagnetized the pair of magnetically biased patterned first magnetic bias layers to form a corresponding pair of partially demagnetized magnetically biased patterned first magnetic bias layers; and (2) magnetized the pair of magnetically un-biased patterned second magnetic bias layer to form a corresponding pair of magnetically biased patterned second magnetic bias layers. There was then measured: (1) a first exchange field, Hex, strength between the pair of partially demagnetized magnetically biased patterned first longitudinal magnetic bias layers and the patterned first magnetoresistive (MR) layer; (2) a first coercivity field, Hc, of the patterned first magnetoresistive (MR) layer; (3) a second exchange field, Hex, strength between the pair of magnetically biased patterned second longitudinal magnetic bias layers and the patterned second magnetoresistive (MR) layer; and (4) a second coercivity field, Hc, of the patterned second magnetoresistive (MR) layer.

There was then thermally annealed the dual stripe magnetoresistive (DSMR) sensor element while employing a third thermal annealing method employing a third thermal annealing temperature of about 300 degrees centigrade for a third thermal annealing time period of about 0.5 hours in absence of a third extrinsic magnetic bias field to: (1) form from the partially demagnetized magnetically biased patterned first longitudinal magnetic bias layers a pair of remagnetized partially demagnetized patterned first longitudinal magnetic bias layers; and (2) form from the pair of magnetically biased patterned second longitudinal magnetic bias layers a pair of further magnetically biased patterned second longitudinal magnetic bias layers. There was then again measured: (1) a first exchange field, Hex, strength between the pair of remagnetized partially demagnetized magnetically biased patterned first longitudinal magnetic bias layers and the patterned first magnetoresistive (MR) layer; (2) a first coercivity field, Hc, of the patterned first magnetoresistive (MR) layer; (3) a second exchange field, Hex, strength between the pair of further magnetically biased patterned second longitudinal magnetic bias layers and the patterned second magnetoresistive (MR) layer; and (4) a second coercivity field, Hc, of the patterned second magnetoresistive (MR) layer.

Measured results for the exchange field, Hex, strengths and the coercivity field, Hc, strengths, as defined above, are reported within Table I, as follows.

TABLE I

| Annealing Conditions | Hex (Oe) | Hc (Oe) | Hex/Hc |
|---|---|---|---|
| For First Magnetoresistive (MR) Layer | | | |
| $1^{st}$ - 300 C./8 hr/2000 Oe | 210 | 90 | 2.3 |
| $2^{nd}$ - 270 C./0.5 hr/−2000 Oe | 50 | 90 | 0.6 |
| $3^{rd}$ - 300 C./0.5 hr/0.0 Oe | 170 | 90 | 1.9 |
| For Second Magnetoresistive (MR) Layer | | | |
| $2^{nd}$ - 270 C./0.5 hr/−2000 Oe | −20 | 60 | −0.3 |
| $3^{rd}$ - 300 C./0.5 hr/0.0 Oe | −130 | 100 | −1.3 |

As is seen from review of the data reported within Table I, there is observed, in accord with that which is disclosed within the preferred embodiment of the present invention and claimed within the claims which follow: (1) a significant recovery of demagnetization of an exchange bias field for a pair of partially demagnetized magnetically biased patterned first longitudinal magnetic bias layers with respect to a patterned first magnetoresistive (MR) layer; and (2) an additional exchange biasing of a pair of magnetically biased patterned second longitudinal magnetic bias layers with respect to a patterned second magnetoresistive (MR) layer, when an anti-parallel magnetic biased dual stripe magnetoresistive (DSMR) sensor element having formed therein the pair of partially demagnetized patterned first longitudinal magnetic bias layers and the pair of magnetically biased patterned second magnetic bias layers is thermally annealed absent an extrinsic magnetic bias field.

As is understood by a person skilled in the art, the preferred embodiment and example of the present invention are illustrative of the present invention rather than limiting of the present invention. Revisions and modifications may be made to materials, structures and dimensions through which is provided a non-parallel magnetically biased multiple magnetoresistive (MR) layer magnetoresistive (MR) sensor element such as the dual stripe magnetoresistive (DSMR) sensor element formed in accord with the preferred embodiment of the present invention while still providing a non-parallel magnetically biased multiple magnetoresistive (MR) layer magnetoresistive (MR) sensor element in accord with the spirit and scope of the present invention, as defined by the following claims.

What is claimed is:

1. A multiple magnetoresistive (MR) layer magnetoresistive (MR) sensor element comprising:
   a substrate;
   a patterned first magnetoresistive (MR) layer formed over the substrate;
   a first magnetic longitudinal bias layer formed contacting the patterned first magnetoresistive (MR) layer, the first magnetic longitudinal bias layer having a first magnetic bias direction;
   a patterned second magnetoresistive (MR) layer separated from the patterned first magnetoresistive (MR) layer by at least a non-magnetic spacer layer; and
   a second magnetic longitudinal bias layer formed contacting the patterned second magnetoresistive (MR) layer, the second magnetic longitudinal bias layer having a second magnetic bias direction, wherein:
   the first magnetic longitudinal bias layer and the second magnetic longitudinal bias layer are formed of a single magnetic bias material;
   the first magnetic bias direction and the second magnetic bias direction are non-parallel and aligned at an acute angle with a longitudinal axis along which said bias layers are separated.

2. The multiple magnetoresistive (MR) layer magnetoresistive (MR) sensor element of claim 1 wherein the multiple magnetoresistive (MR) layer magnetoresistive (MR) sensor element is employed within a magnetic head selected from the group consisting of merged inductive magnetic magnetic write magnetoresistive (MR) read magnetic heads, non-merged inductive magnetic write magnetoresistive (MR) read magnetoresistive (MR) heads and magnetoresistive (MR) read only heads.

3. A magnetic data storage enclosure having fabricated therein said magnetic head of claim 2.

4. The multiple magnetoresistive (MR) layer magnetoresistive (MR) sensor element of claim 1 wherein the single magnetic bias material is selected from the group consisting of antiferromagnetic magnetic bias materials and permanent magnet magnetic bias materials.

5. The multiple magnetoresistive (MR) layer magnetoresistive (MR) sensor element of claim 1 wherein the multiple magnetoresistive (MR) layer magnetoresistive (MR) sensor element is a dual spin valve magnetoresistive (DSVMR) sensor element.

6. The multiple magnetoresistive (MR) layer magnetoresistive (MR) sensor element of claim 1 wherein the multiple magnetoresistive (MR) layer magnetoresistive (MR) sensor element is a dual stripe magnetoresistive (DSMR) sensor element.

* * * * *